United States Patent [19]

Leu et al.

[11] Patent Number: 5,740,580
[45] Date of Patent: Apr. 21, 1998

[54] STEPPER VACUUM CHUCK WIPER

[75] Inventors: Chung-Chien Leu; Hsi-Huang Lee; En-Tien Tan, all of Hsinchu, Taiwan

[73] Assignee: United Microelectronics Corporation, Taiwan

[21] Appl. No.: 757,679

[22] Filed: Nov. 29, 1996

[30] Foreign Application Priority Data

Oct. 11, 1996 [TW] Taiwan ................ 85112455

[51] Int. Cl.$^6$ ................................. A47L 25/00
[52] U.S. Cl. ................. 15/210.1; 15/105; 362/91; 362/119
[58] Field of Search ................ 15/97.1, 102, 105, 15/210.1; 362/89, 91, 119, 120

[56] References Cited

U.S. PATENT DOCUMENTS

| 2,232,680 | 2/1941 | Foster | 15/210.1 |
| 4,642,738 | 2/1987 | Meller | 362/119 |
| 4,845,796 | 7/1989 | Mosley | 362/91 |

FOREIGN PATENT DOCUMENTS 922239  3/1963  United Kingdom ............ 15/210.1

*Primary Examiner*—Randall Chin
*Attorney, Agent, or Firm*—Rabin, Champagne & Lynt, P.C.

[57] ABSTRACT

The present invention discloses a stepper vacuum chuck wiper for cleaning a stepper vacuum chuck, which includes a rod frame, a bearing device, a flare type soft shield, a wiping stick and an illuminating device. The rod frame has a through hole at one end and the bearing device is sleeved inside of the through hole. The flare type soft shield with a flare opening on its lower end is sleeved inside the bearing device, and the diameter of the flare opening is larger than the outside diameter of the bearing device. The wiping stick is sleeved inside the flare type soft shield. The illuminating device for illuminating the stepper vacuum chuck includes a light source, a battery set and a switch. The battery set is coupled to the other end of the rod frame to provide electricity to the light source, and the switch is coupled between the battery set and the light source to control the illumination of the light source, wherein the light source and the switch are disposed on the rod frame.

8 Claims, 3 Drawing Sheets

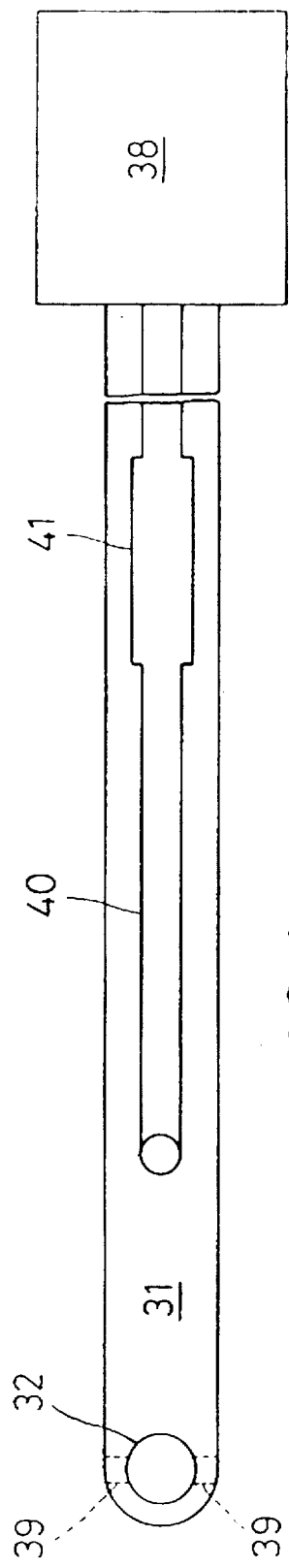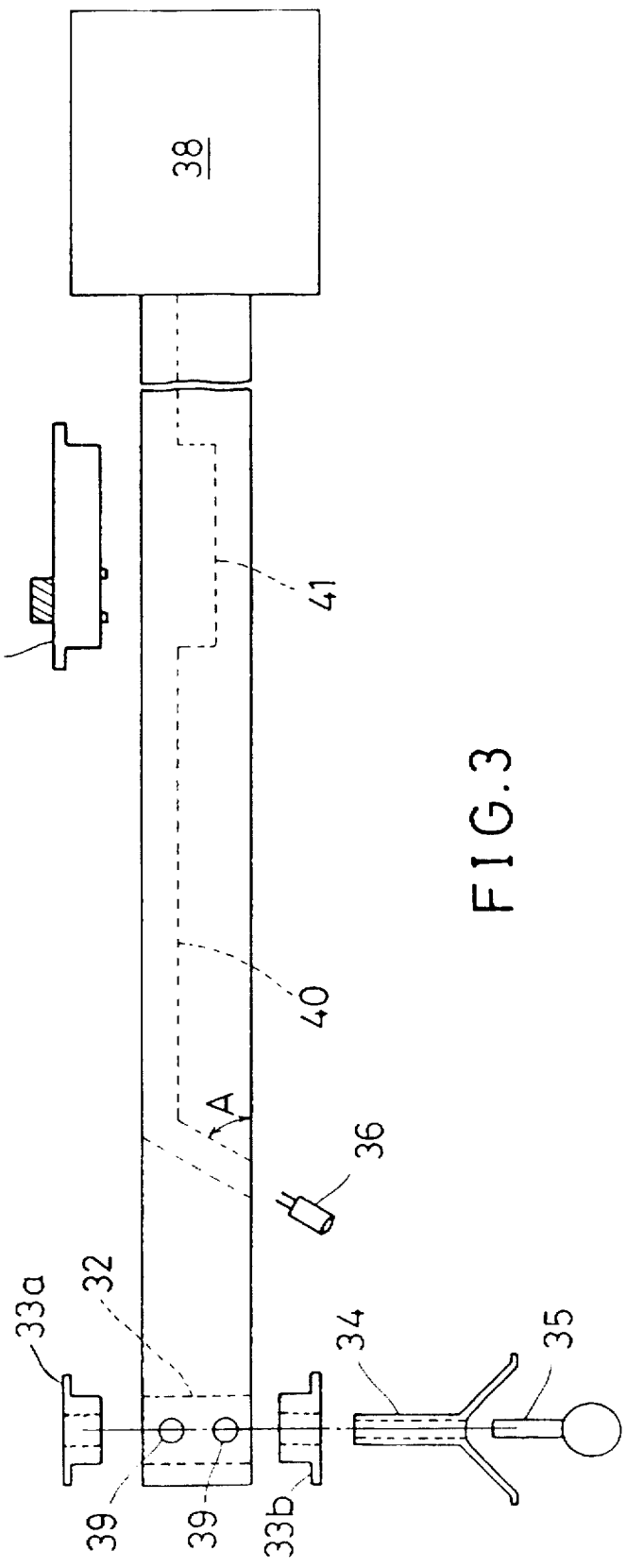
FIG.4
FIG.3

STEPPER VACUUM CHUCK WIPER

BACKGROUND OF THE INVENTION

1. Field of the Invention

This invention relates in general to a stepper vacuum chuck wiper, and more particularly to a wiping tool applied to a stepper vacuum chuck.

2. Description of Related Art

Photolithography is one of the most important steps in the process of semiconductor fabrication. All that relates to the structure of the metal oxide semiconductor (MOS) device, such as patterns of films and areas of dopants, are determined by the photolithography step. Presently, step and repeat projection printing is used repeatedly to perform the exposure step of photolithography. The projection printer used for performing this step and repeat projection printing is termed "stepper". This "stepper" uses a vacuum chuck to fix wafers.

Referring to FIG. 1 and FIG. 2, FIG. 1 is a front view of a round vacuum chuck, and FIG. 2 is a magnified partial cross-sectional illustration of a section 11 of FIG. 1. In FIG. 2, numeral 21 indicates the high vacuum passageway high vacuum of the vacuum chuck 12. Since the vacuum chuck 12 is used often, it is frequently polluted by dirt and particles (shown by numeral 22 in FIG. 2) that effects the fixture of wafers. This reduces the quality of photolithography. Additionally, since the quality of photolithography is reduced whenever the operational environment is polluted by dirt and particles 22, it is necessary to clean the vacuum chuck 12 frequently. Usually, the vacuum chuck 12 is cleaned using a lintless cloth moistened with alcohol or ethyl ether to wipe the surface of the vacuum chuck 12, but the dirt and particles in the recesses and grooves of the vacuum chuck 12 are more difficult to remove and thus can not be cleaned as efficiently.

SUMMARY OF THE INVENTION

It is therefore an object of the present invention to provide a stepper vacuum chuck wiper, to easily and effectively clean the surface of the vacuum chuck.

The present invention achieves the above-identified objects by providing a stepper vacuum chuck wiper for cleaning a stepper vacuum chuck, which includes a rod frame, a bearing device, a flare type soft shield, a wiping stick and an illuminating device. The rod frame has a through hole at one end and the bearing device is sleeved inside the hole. The flare type soft shield with a flare opening on its lower end is sleeved inside the bearing device, and the diameter of the flare opening is larger than the outside diameter of the bearing device. The wiping stick is sleeved inside the flare type soft shield. The illuminating device is provided for illuminating the stepper vacuum chuck includes a light source, a battery set, and a switch. The battery set is coupled to the other end of the rod frame to provide electricity to the light source, and the switch is coupled between the battery set and the light source to control the illumination of the light source, wherein the light source and the switch are disposed on the rod frame.

According to a preferred embodiment of the present invention, the stepper vacuum chuck wiper uses a wiping stick moistened with alcohol or ethyl ether which can dip into the recesses and grooves of the vacuum chuck in order to remove dirt and particles therein. Since the wiping stick spins because of the bearing, it keeps the wiped area from being polluted again by dirt and particles attached on the wiping stick. Moreover, the illuminating device on the rod frame can illuminate the vacuum chuck, making the cleaning process easier and more effective.

BRIEF DESCRIPTION OF THE DRAWINGS

Other objects, features, and advantages of the present invention will become apparent by way of the following detailed description of the preferred but non-limiting embodiments. The description is made with reference to the accompanying drawings in which:

FIG. 3 is an enlarged front view of the parts of a preferred embodiment of a vacuum chuck wiper according to the present invention;

FIG. 4 is a top view of a rod frame of the preferred embodiment in FIG. 3;

DESCRIPTION OF THE PREFERRED EMBODIMENT

Figure 1:
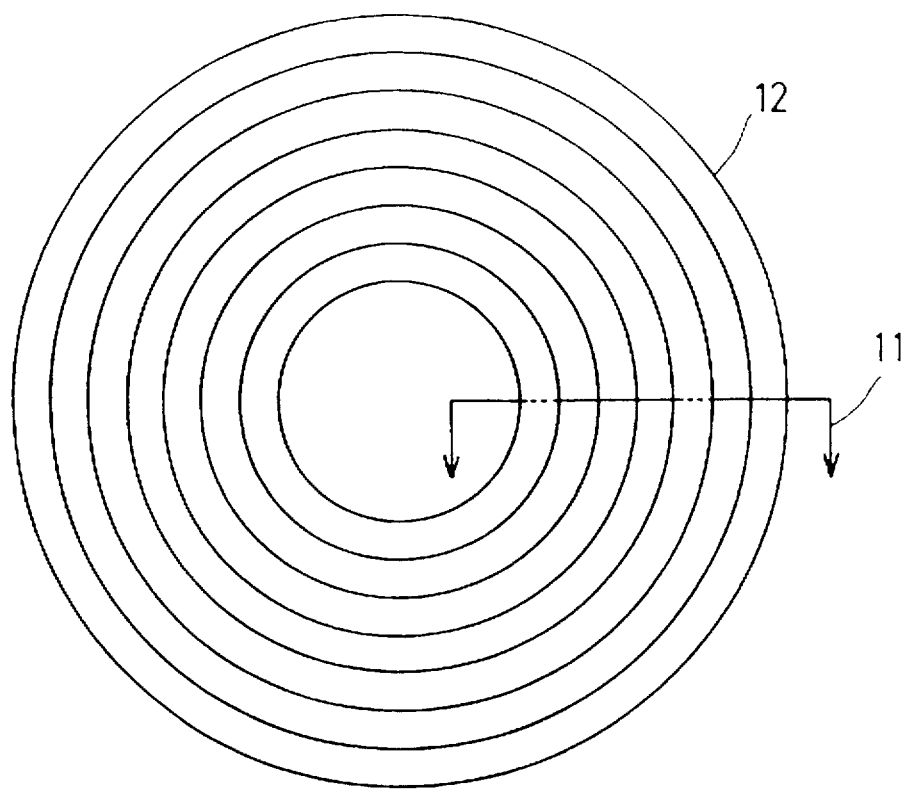
FIG. 1 is a front view of a vacuum chuck.
Figure 2:
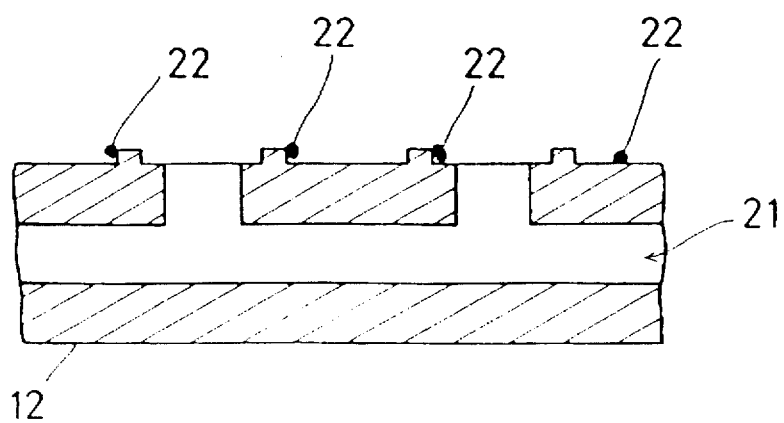
FIG. 2 is an enlarged partial cross-sectional diagram of a vacuum chuck.

Please refer to FIGS. 3 and 4. A preferred embodiment of the present invention of stepper vacuum chuck wiper is shown in FIG. 3, and consists of a rod frame 31 having a through hole 32 at its first end, a bearing device which is composed of two bearings 33a and 33b in this embodiment, a flare type soft shield 34, a wiping stick 35, and an illuminating device. The illuminating device includes a light source 36, a switch 37, and a battery set 38. In the present embodiment, the rod frame 31 is made of metal. However, it can also be made of a suitable plastic material. Bearings 33a and 33b are ball bearings which are sleeved at the upper and lower ends of the inside of the through hole 32, at the first end of the rod frame 31, by drilling a plurality of screw holes 39 around the through hole 32 and fixing bearings 33a and 33b with screws. The flare type soft shield 34 made of rubber with a flare opening on its lower end is sleeved inside the bearings 33a and 33b. The diameter of the flare opening is larger than the outside diameter of the bearings 33a and 33b. The wiping stick 35 is a swab, which is sleeved inside the flare type soft shield 34. The light source 36 is a light-emitting diode with high illumination. The battery set 38 is coupled to the second end of the rod frame 31 to provide electricity to the light source 36. The cylindrical shell of the battery set is easy to grip. The switch 37 is coupled between the light 36 and the battery set 38 by wire to control the illumination of the light 36. The light 36 and the battery set 38 are both disposed on the rod frame 31. For example, a wire guiding groove 40 and a switch disposing groove 41 are formed on the rod frame 31 so that the light 36, switch 37 and wires coupled between the light source 36, the switch 37 and the battery set 38 are located and fixed therein. The light source 36 is disposed in the wire guiding groove 40 with an appropriate angle A, e.g. 45°, so that it illuminates the vacuum chuck clearly.

Figure 5:
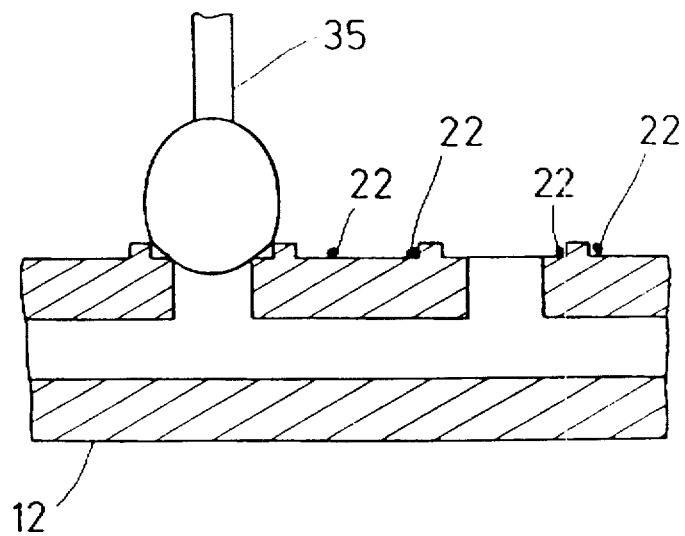
FIG. 5 is a cross-sectional view of the vacuum chuck wiper in use.
Figure 6:
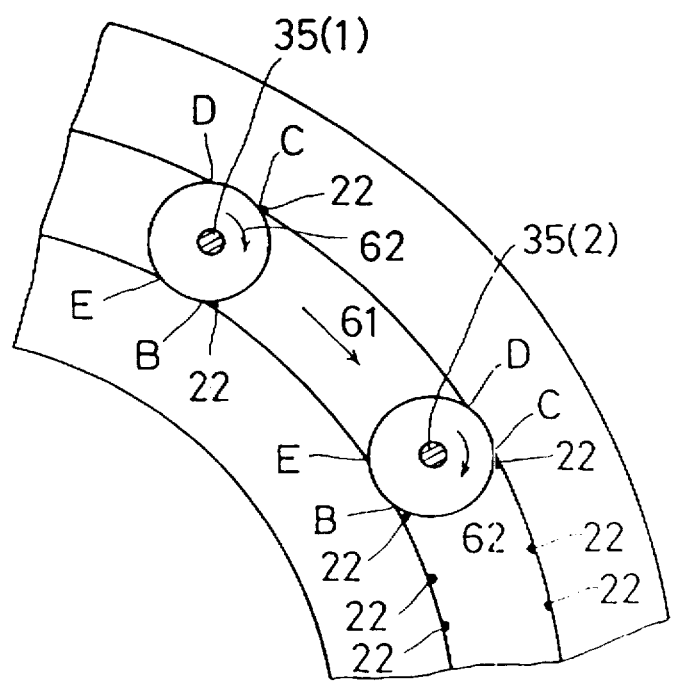
FIG. 6 is a top view of the vacuum chuck wiper in use.

Referring to FIG. 5, it is a cross-sectional view of the vacuum chuck wiper in use. Since the present invention uses a wiping stick 35 to clean the vacuum chuck 12, it can dip into the recesses and grooves of the vacuum chuck 12 to remove dirt and particles 22 for improving the cleaning effect. In the present embodiment, due to the design of the bearing device, while cleaning dirt and particles 22, the wiping stick 35 will spin along its path with a continually clean surface contacting the wiped area thus keeping the wiped area from being polluted again by the dirt and particles from the wiping stick 35. Referring to FIG. 6, it is a top view of the vacuum chuck wiper in use. In the Figure, numeral 35(1) represents the first position of the wiping stick 35 of the stepper vacuum chuck wiper. Numeral 35(2) represents the second position of the wiping stick 35 of the stepper vacuum chuck wiper. At the first position, portions B and C of the wiping stick 35 are used to contact the surfaces to be cleaned. Portions D and E of the wiping stick 35 are used to contact the surfaces that have already been cleaned. When the wiping stick 35 moves from the first position to the second position along path 61, it spins simultaneously in the direction of the arrow 62 because it is mounted on the bearing device. Therefore, at the second position, portions B and C of the wiping stick 35 still contact the surfaces to be cleaned. Portions D and E of the wiping stick 35 contact the surfaces that had been cleaned. Dirt and particles 22 attached on portions B and C will not contact or contaminate the surfaces that have been cleaned. This flare type soft shield has three merits: (1) The wiping stick is tightly sleeved in the bearings to prevent the failing of dirt and particles in wiping. This further prevents particles from dropping and contaminating the surface of the vacuum chuck when the bearing rotates. (2) The sleeved portion prevents detergent on the wiping stick from seeping into the bearings reducing the lubrication effect that results in decreased bearing life. (3) Furthermore, the illuminating device is another characteristic of the present invention, which provides illumination at the vacuum chuck for user to find the polluted area and remove dirt effectively.

While the invention has been described by way of example and in terms of preferred embodiment, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A stepper vacuum chuck wiper for cleaning a stepper vacuum chuck, which comprises of:

a rod frame having a first end and a through hole at said first end;

a bearing device having an outside diameter and being sleeved inside of the through hole;

a flare type soft shield with a lower end having a flare opening, sleeved inside the bearing device, wherein the flare opening has a diameter larger than the outside diameter of the bearing device;

a wiping stick sleeved inside the flare type soft shield; and an illuminating device for illuminating the stepper vacuum chuck, including a light source, a battery set coupled to a second end of the rod frame to provide electricity to the light source, and a switch coupled between the battery set and the light source to control the illumination of the light source, and the light source and the switch being disposed on the rod frame.

2. A stepper vacuum chuck wiping stick according to claim 1, wherein the rod frame is made of metal.

3. A stepper vacuum chuck wiping stick according to claim 1, wherein the through hole has first and second ends and the bearing device includes first and second ball bearings respectively sleeved to the first and second ends of the through hole.

4. A stepper vacuum chuck wiping stick according to claim 1, wherein the soft flare shield is made of rubber.

5. A stepper vacuum chuck wiping stick according to claim 1, wherein the illuminating device includes a light-emitting diode with high illumination.

6. A stepper vacuum chuck wiping stick according to claim 1, wherein a shell of the battery set of the illuminating device forms a cylindrical handle.

7. A stepper vacuum chuck wiping stick according to claim 1, wherein the wiping stick is a swab.

8. A stepper vacuum chuck wiping stick according to claim 1, wherein the rod frame is made of plastic.

* * * * *